Aug. 10, 1965 W. KAMINSKI ETAL 3,200,347

FREQUENCY CONTROL FOR MULTIFREQUENCY PHASE LOCK GENERATORS

Filed Dec. 29, 1961 3 Sheets-Sheet 1

INVENTORS W. KAMINSKI
H. A. SCHNEIDER

BY [signature]

ATTORNEY

INVENTORS W. KAMINSKI
H.A. SCHNEIDER
BY [signature]
ATTORNEY

Aug. 10, 1965 W. KAMINSKI ETAL 3,200,347

FREQUENCY CONTROL FOR MULTIFREQUENCY PHASE LOCK GENERATORS

Filed Dec. 29, 1961

3 Sheets-Sheet 3

INVENTORS W. KAMINSKI
H. A. SCHNEIDER
BY [signature]
ATTORNEY 3,200,347
FREQUENCY CONTROL FOR MULTIFREQUENCY PHASE LOCK GENERATORS
William Kaminski, West Portal, and Herbert A. Schneider, Millington, N.J., assignors to Bell Telephone Laboratories, Incorporated, New York, N.Y., a corporation of New York
Filed Dec. 29, 1961, Ser. No. 163,347
4 Claims. (Cl. 331—16)

This invention relates to multifrequency generators and more particularly to frequency stabilization of multifrequency generators.

There are many ways of producing a plurality of frequencies to be employed in particular applications. For example, the output of two frequency generators may be beat together to produce a plurality of frequencies by frequency addition or subtraction, or the output of a single frequency oscillator may be split up and then increased or decreased in different multiples by frequency multiplication or division and the resultant frequencies combined by frequency synthesis. In any of the processes involving frequency addition or subtraction or synthesis, it has been found that a phase-locked oscillator may be used to particular advantage as a sharp filter as well as a basic multifrequency generator.

One advantageous multifrequency generator employs both frequency addition and phase-locked oscillators as suggested above to attain highly precise control of both the absolute frequency of individual output frequencies and the spacing between available frequencies. This generator utilizes a phase-locked oscillator as the primary source of the plural signals of controlled and related frequencies together with a second phase-locked oscillator and a crystal oscillator, which serves as a source of so-called transfer frequency, to perform the frequency addition operation. The three oscillators cooperate so that the second phase-locked oscillator will operate in a frequency range determined in extent by the first or primary oscillator and in frequency by the transfer oscillator.

The primary oscillator may, for example, be of the kind disclosed in our copending application, Serial No. 163,345, filed December 29, 1961, now Patent 3,139,593 issued June 30, 1964 in which the control loop of a phase-locked oscillator includes frequency determining elements which may be mechanically switched in circuit to select a particular one of a number of harmonically related output frequencies which are linearly related and have equal tuning ranges over which phase-lock operation occurs.

Typically, phase-lock oscillators are controlled by a comparison gate which serves in the phase-lock loop to compare a reference signal (here a pulse from the primary source) and a sinusoidal signal derived at least in part (if a transfer oscillator is used) or entirely from the output of the oscillator under phase-lock control. Under these circumstances difficulties are encountered because the range of stable operation of the comparison gate, limited in the first instance, is further restricted when a frequency other than that for which the loop is first set up is required. This occurs because the loop can be adjusted to have the comparison gate sample the sine wave at the zero crossing for only one frequency. For any other selected channel, sampling occurs at other than zero crossing and the phase margin of control available becomes dependent upon which of the available output frequencies from the primary source is selected.

Therefore, it is an object of the present invention to make the phase margin of the phase-locked oscillator independent of channel selection.

In accordance with the invention, therefore, in a multifrequency generator having a first phase-locked oscillator that determines the number of channels available and the frequency spacing therebetween, a transfer oscillator having an output of a fixed stable frequency, and a second phase-locked oscillator in which the signals from the first phase-locked oscillator and the transfer oscillator are combined to provide a plurality of channels at a high frequency, there is provided a means for making the phase margin of the second phase-locked oscillator independent of channel selection. The second phase-locked oscillator is tuned over its range of operation by changing the bias on at least one component of its frequency determining circuit. This bias is supplied by a compensation network that is tuned in conjunction with the tuning of the first phase-locked oscillator, so that the necessary bias is almost completely supplied by said tuning network, thereby permitting the sampling of the feedback signal from said first phase-locked oscillator to the phase detector to take place at all times at substantially the zero crossing thereof once phaselock is established.

It is obvious that the primary oscillator, mentioned heretofore, need not be a phase-locked oscillator and that the advantageous features of the invention are available for use in any multifrequency generator in which the primary oscillator channel selection is made in such a way that the compensation network for the second oscillator phase-lock loop can be correspondingly tuned or adjusted.

These and other features of the invention will appear more clearly and fully upon consideration of the following specification taken in connection with the drawings in which.

Figure 1:
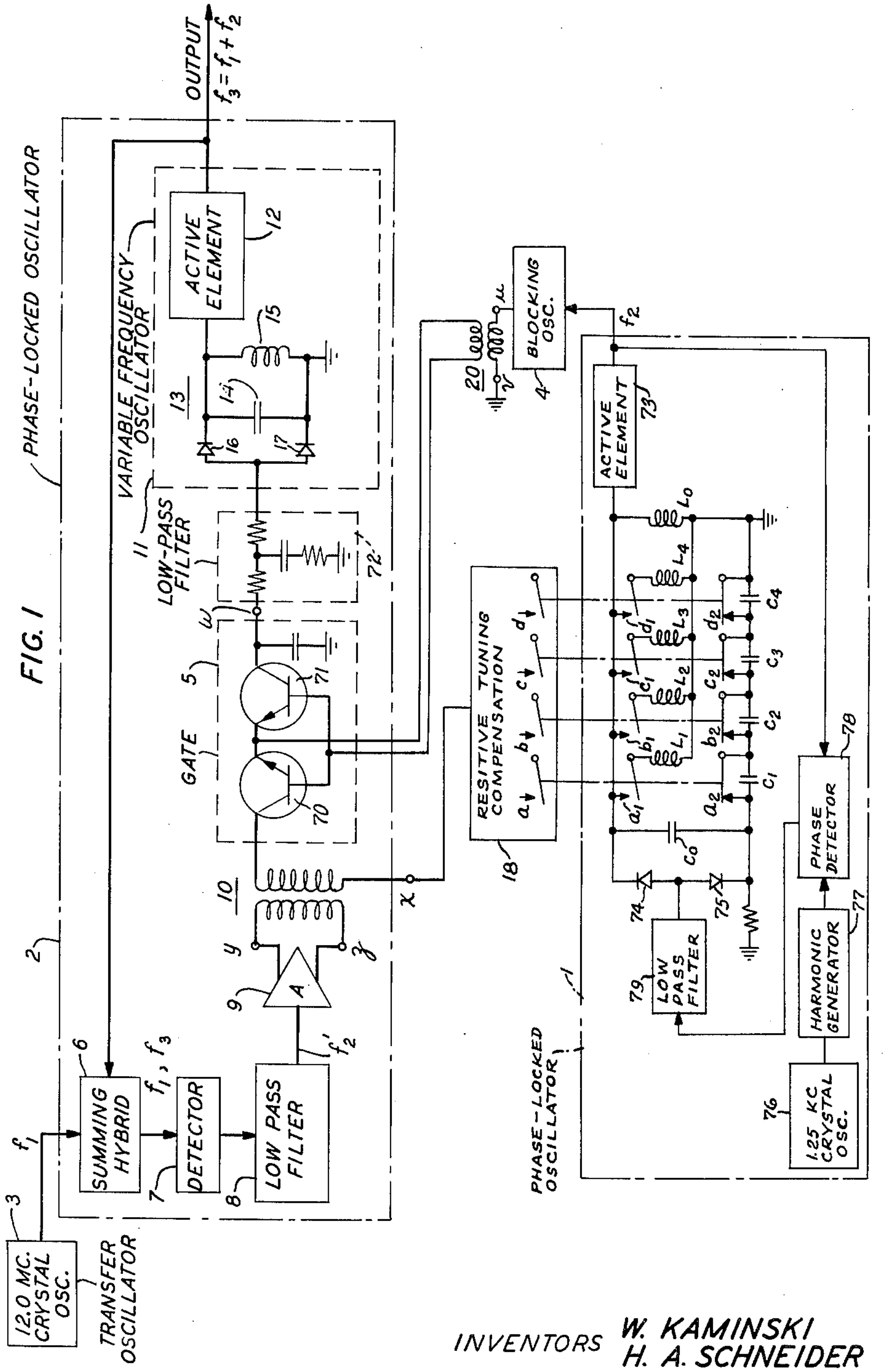
FIG. 1 is a schematic diagram, partially in block form, of a multifrequency generator employing frequency addition and incorporating the compensation arrangement of the invention.

A typical frequency adder is shown in FIG. 1 and comprises a first phase-locked oscillator 1 having a frequency output of $f_2$, a second phase-locked oscillator 2 having a frequency output of $f_3$ and a transfer oscillator 3 having a frequency output $f_1$. This frequency adder will be described as having a possible output of 16 channels, the number of channels being determined by the construction of the first phase-locked oscillator 1. However, this first phase-locked oscillator is not limited to 16 channels, but may have an output of several hundred channels.

For illustrative purposes, the phase-locked oscillator 1 of FIG. 1 is described as a 16-channel generator. It may be, for example, the type disclosed in our above-identified copending application in which a variable frequency oscillator comprising an active element 73 and a frequency determining network having a permanently connected inductor-capacitor pair $L_0$–$C_0$, temporarily insertable inductor-capacitor pairs of $L_1$–$C_1$, $L_2$–$C_2$, $L_3$–$C_3$, $L_4$–$C_4$, and varactors 74, 75 is synchronized to a harmonic of a highly stable crystal oscillator 76. Inductor $L_0$ and capacitor $C_0$ are connected in parallel with one another, inductors $L_1$, $L_2$, $L_3$, and $L_4$ are insertable in parallel with inductor $L_0$, and capacitors $C_1$, $C_2$, $C_3$, and $C_4$ are insertable in series with capacitor $C_0$. The output of crystal oscillator 76 is applied to a harmonic generator 77, which could be a blocking oscillator. Switch pairs $a_1$–$a_2$, $b_1$–$b_2$, $c_1$–$c_2$, and $d_1$–$d_2$ may be operated in any one of 16 combinations to bring the output of oscillator 1 close in frequency to one of 16 harmonics emanating from generator 77. A phase-locked loop including a phase detector 78, a low-pass filter 79, and varactors 74 and 75 locks the output of the variable frequency oscillator, represented by $f_2$, precisely into phase with the harmonic of crystal oscillator 76 chosen by operation of the switches.

The output of phase-locked oscillator 1 passes through a blocking oscillator 4, where it is changed into a series of pulses. These pulses are thereafter applied through a transformer 20 to a phase sampling gate 5, which forms a part of phase-locked oscillator 2, as the gate control signal.

The output of phase-locked oscillator 2, which will be described in detail hereinafter, is combined in summing hybrid 6 with the output from transfer oscillator 3, thereby producing an output that is a combination of the frequencies $f_1$ and $f_3$. This combined signal is thereafter coupled into detector 7, wherein the difference frequency $f_2'$ is produced. This difference frequency is approximately equal to the output frequency of phase-locked oscillator 1. This signal is then applied to a low-pass filter 8, which could also be a bandpass filter, wherein the signal of frequency $f_2'$ is selected. The output of low-pass filter 8 is fed through an amplifier 9 and appears as a sine wave across the primary winding of a transformer 10. This alternating-current signal is then applied through transformer 10 to gate 5, which acts as a phase sampler or detector. Gate 5 supplies the correction voltage for variable frequency oscillator 11 to a low-pass filter 72, which integrates this voltage before application to oscillator 11.

As shown in FIG. 1, phase-locked oscillator 2 includes a variable frequency oscillator 11 and a phase-lock control loop in which a portion of the output of oscillator 11 is applied in order to permit stabilization of the oscillator. This loop includes summing hybrid 6, detector 7, low-pass filter 8, and amplifier 9 to which reference has already been made.

Variable frequency oscillator 11 comprises an active element 12, such as a transistor or vacuum tube amplifier, shown in block form, and a frequency determining circuit 13 comprising the parallel combination of capacitor 14 and inductor 15 and a tuning network comprising varactors 16 and 17 connected across the parallel combination. Variable frequency oscillator 11 is therefore tuned through its entire range by varying the capacitance of these varactors 16 and 17 achieved through change of the direct-current bias applied thereto.

The varactor bias may comprise a fixed portion supplied by a battery, for example, and a variable portion that varies in accordance with the phase difference between the output signal from the first phase-locked oscillator and the output signal of a difference frequency amplifier having a frequency substantially equal to the output frequency of the first phase-locked oscillator. This variable portion may be supplied by a phase detector which may be one of the many known types.

However, when the phase detector in the second phase-locked oscillator is of the sine wave sampler type, like the one shown as gate 5 in FIG. 1, it will have a limited range of operation of ±90°. Such a phase detector is described in Patent 2,899,570, granted August 11, 1959, to J. D. Johannesen, P. B. Myers, and J. E. Schwenker, and operation of the generator thus far described.
assigned to the assignee of this application. As described in Patent 2,899,570, pulses transmitted to the control terminals of the gate by transformer 20 bias the base to emitter circuits of transistors 70 and 71 into conduction, thus permitting transmission of the signal at the collector of transistor 70 to the collector of transistor 71. During intervals in which no pulse is applied to the control terminals, a high impedance path exists between the collectors of transistors 70 and 71. Thus, the sine wave appearing across transformer 10 is periodically sampled to detect its phase. There is a possibility the phase-locked oscillator will not remain in lock at the extremities of the frequency range of operation. The effect of this deficiency and the elimination of this effect according to the invention will be considered below in considering the operation of the generator thus far described.

The operation of the frequency adder will be herein described by using specific frequencies which are to be in no way limiting but only illustrative. Phase-locked oscillator 1 may have, for example, an output of 16 channels spaced 1.25 kilocycles apart, ranging from 25 to 43.75 kilocycles, and the transfer oscillator 3 may have an output frequency of 12 megacycles. Therefore, the output frequency of phase-locked oscillator 2 employed as a frequency adder will range between 12.025 megacycles and 12.04375 megacycles.

Figures 2, 4, 4A, 5, 5A, 6A:
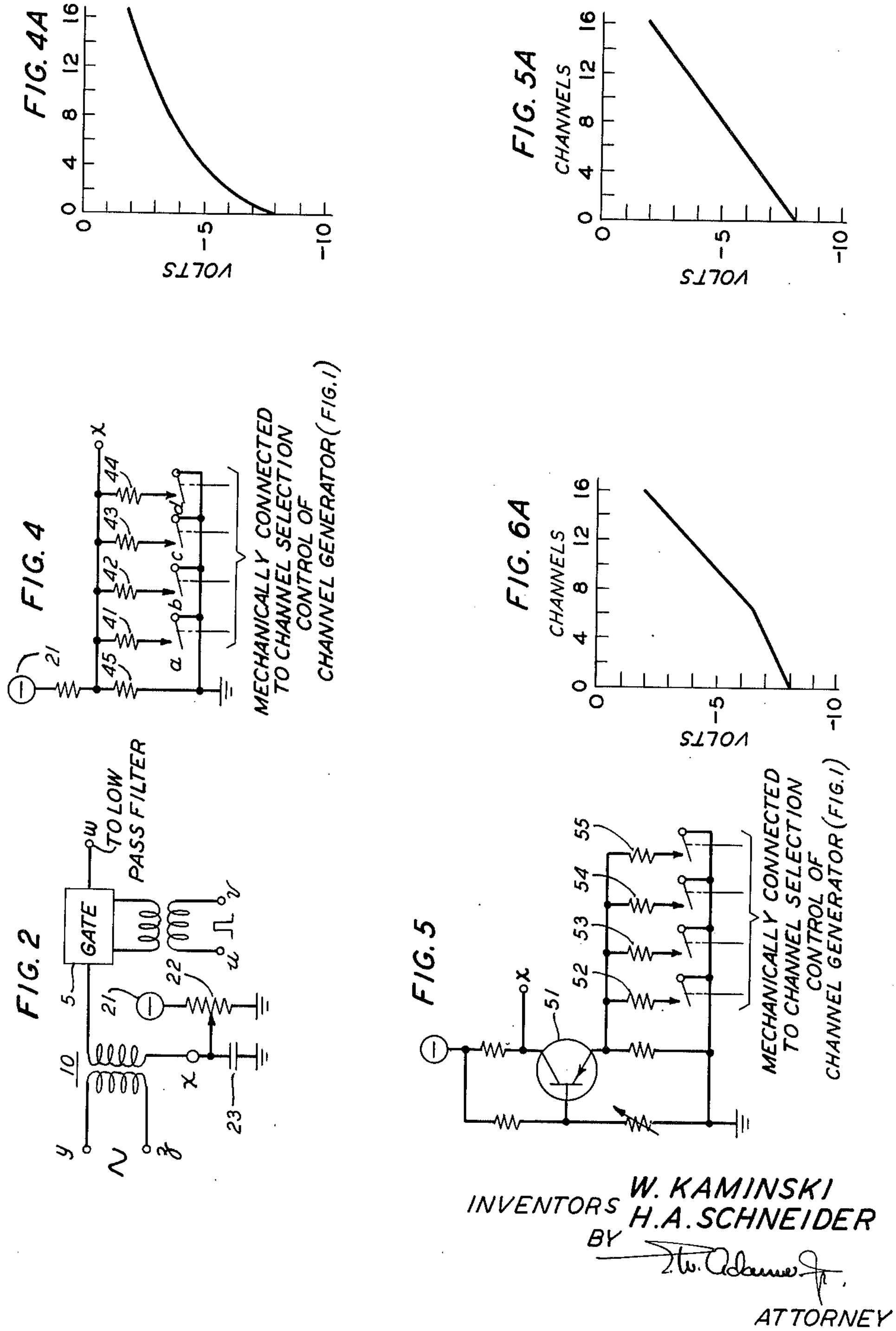
FIG. 2 is a schematic circuit of the bias circuit for the tuning element of the variable frequency oscillator shown in FIG. 1.
FIGS. 4, 5 and 6 are schematic diagrams of resistive tuning compensation circuits in accordance with the invention.
FIGS. 4A, 5A and 6A are graphs showing the output voltage obtainable from the respective resistive tuning compensation circuits of FIGS. 4, 5, and 6.
Figure 3:
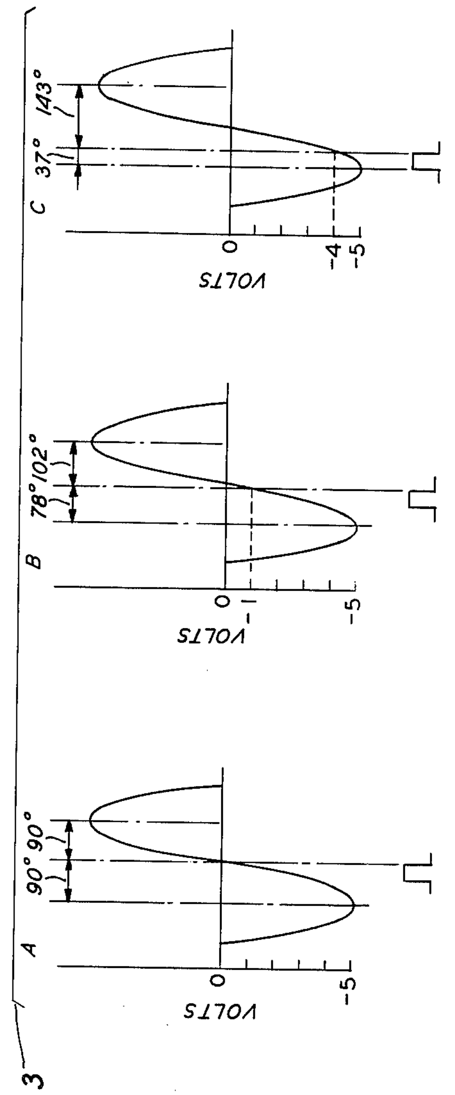
FIG. 3 is a group of curves representing certain voltages in the phase detector or gate employed in the circuit of FIG. 1.

For purposes of illustration, it will be assumed that phase-locked oscillator 2 is to be set up near the midpoint of operation; and, for the case herein described, this will occur at approximately 12.035 megacycles. Phase sampling gate 5 of phase-locked oscillator 2 normally has a fixed bias supply connected to its input terminal $x$ (FIG. 2). The potential of this supply will be passed by gate 5 and low-pass filter 72 and applied to varactors 16 and 17 of the variable frequency oscillator 11 (FIG. 1). Between points $y$ and $z$ of the primary of transformer 10 appears a sine wave having a frequency of $f_2'$, which is approximately equal to the output frequency of phase-locked oscillator 1. The output of phase-locked oscillator 1 appears between points $u$ and $v$ of transformer 20 as the gating pulse for phase sampling gate 5. The bias appearing at point $x$ of FIG. 2 is now adjusted so that the sampling of the input sine wave takes place at its zero crossing. The total bias at this time is then supplied by the bias supply of FIG. 2 comprising power supply 21, potentiometer 22 and capacitor 23. This mode of operation is shown as curve A in FIG. 3, where the sine wave represents the input signal between points $y$ and $z$ of transformer 10 and the square wave pulse represents the gating signal input between points $u$ and $v$ of transformer 20. It is seen that the gate or phase sampler now has a range of ±90° over which it may vary and still permit the oscillator to remain in lock.

Now, if it is desired to change the frequency of operation to 12.04375 megacycles, for example, it will be necessary to change the bias on the varactors 16 and 17, so that their capacitance will decrease. This bias must be supplied by the input sine wave from the difference frequency amplifier 9. It may be necessary that this bias be increased by a negative 4 volts and, as seen in curve C of FIG. 3, the input sine wave would now have to be sampled at a point removed from the midpoint or the point of zero crossing. It is seen that a margin of safety of only 37° will exist rather than the desired 90°. Therefore, in order to sample near the zero crossing at all times, it is necessary to provide another means for producing the variable bias, while permitting the sine wave to supply only that bias necessary to correct for any possible errors.

In FIG. 1 this other means is shown in block form as resistive tuning compensation 18. This resistive tuning compensation network may be of many forms but it is desirable that its output vary approximately in a manner corresponding to the capacitance-voltage characteristic of the variable capacitor network of varactors 16 and 17. The resistive tuning compensation network 18 is controlled by the switch pairs of phase-locked oscillator 1, as for example, by ganging switches in resistive tuning compensation network 18 to the switch pairs $a_1$–$a_2$, $b_1$–$b_2$, $c_1$–$c_2$, and $d_1$–$d_2$, respectively, so that as a channel of operation is selected, the resistive tuning compensation network 18 will have its output varied, thereby approximately biasing the varactors 16 and 17 to the desired point. As is well known in the art, varactors have a nonlinear capacitance-voltage characteristics, that is, for an equal change of voltage at a small capacitance and at a large capacitance, the change in the capacitance will not be the same. Therefore, it may require a much larger change in voltage to change the capacitance enough to effect the desired change in frequency of operation at one point in the frequency range than required at another. It is then desirable to make the resistance tuning compensation network 18 have a larger change in voltage for some channels than for others.

A simple resistive tuning compensation network such a nonlinear relationship is shown in FIG. 4. The network comprises a plurality of passive elements connected across a source of potential 21, thereby effectively creating a voltage divider network. This network will be connected to terminal *x* in FIG. 2 to replace the fixed bias network thereof. Resistors 41 through 44 are selectively connected across resistor 45 to cause a variation in the voltage between point *x* and ground. The presence of these resistors is controlled by contacts *a, b, c* and *d,* which are in turn controlled by the switches in the phase-locked oscillator 1 (FIG. 1), by which the frequency of operation of phase-locked oscillator 1 is selected.

When the source of potential 21 is supplying a negative 10 volts, for example, the voltage appearing at point *x* may be made to vary from 8 volts to 2 volts by controlling the presence of resistors 41 through 44 in parallel connection with resistor 45. This voltage appearing at point *x* of FIG. 4 is graphically represented in FIG. 4A where, for each channel selected of the 16 channels available, the output voltage and thereafter the bias on the varactors 16 and 17 will be changed nonlinearly. However, the particular varactors used in any variable frequency oscillator may have a voltage-capacitance characteristic that is nonlinear in the opposite sense to the nonlinearity of the output voltage of the circuit in FIG. 4. Therefore, in order to more closely approximate the voltage-capacitance characteristic of the varactors, the network of FIG. 5 may be employed. This circuit utilizes an active element 51 in conjunction with resistive elements 52 through 55, which are inserted in the circuit under the control of the channel selection control of phase-locked oscillator 1 (FIG. 1). This circuit is essentially a constant current circuit whereby the output voltage appearing at point *x* will vary substantially linearly as is graphically shown in FIG. 5A.

Figure 6:
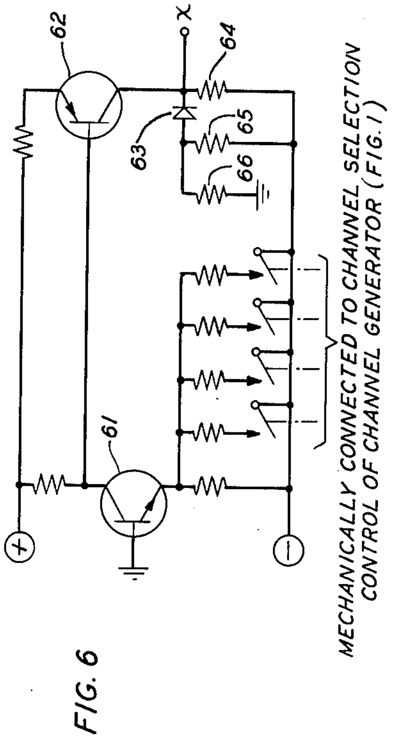

A further change from the nonlinear output of the circuit in FIG. 4 may be attained by the employment of the circuit in FIG. 6. This circuit essentially employs a constant current generator comprising transistor 61 and its related resistors supplying a voltage having a linear relationship to transistor 62. This linearly varying voltage will thereafter appear at point *x*. However, by the employment of diode 63, the output voltage appearing at point *x* will have a stepwise linear relationship wherein for a certain range of voltages the diode will be nonconducting so that the output will be developed only across resistor 64 and will have one slope and for the range beyond this the diode will conduct and the output will be developed across resistors 64, 65, and 66 and will therefore have a second slope. The output voltage at point *x* of FIG. 6 is shown graphically in FIG. 6A, wherein the point where the two curves intercept represents the point where diode 63 begins conduction.

The principles of this invention are in no way limited to multifrequency generators employing frequency adders, but may be utilized equally as well in frequency subtractors or synthesizers.

What is claimed is:

1. A multifrequency generator comprising a first source capable of generating a plurality of stable frequencies, means for selecting one of said frequencies as the output of said first source, a second source for generating a fixed stable frequency, a third source controlled to generate a signal having a frequency that is equal to the sum of the frequencies of the outputs from said first and said second sources, means for mixing the output signal from said second source and the output signal from said third source to produce a signal having a frequency approximately equal to the frequency of the output signal from said first source, said third source having a frequency determining circuit comprising a fixed inductor, a fixed capacitor, and a varactor for precisely tuning said third source all connected in parallel, and means for varying the bias on said varactor to determine the frequency of operation of said third source, said bias varying means comprising two voltage sources connected in series, one of said voltage sources providing a first component being responsive to said selecting means and biasing said varactor near the frequency of said sum frequency, the other of said voltage sources comprising phase comparing means for obtaining the phase difference between the output of said first source and the output of said mixing means and producing a second component related to said phase difference, said second component biasing said varactor to cause precise phase lock of said third source to the sum of the frequency of said first and second sources.

2. In combination, a first variable frequency source, means for selecting a frequency for the output of said source, a second variable frequency source having a frequency tuning element permitting variation of said second source over a frequency range equal to the frequency range of said first source in response to applied signals, said second source to be operated at a frequency related to the frequency of the output of said first source, a first source of control signals the output of which is regulated by said selecting means, the output of said first source of control signals being of such value as to bias said tuning element near said related frequency, a second source of control signals comprising phase comparing means for obtaining the phase difference between the outputs of said first and second variable frequency sources and producing an output which is dependent upon said phase difference, the output of said second source of control signals being of such value as to bias said tuning element to lock the phase of the output of said second variable frequency source onto said related frequency, and means for applying the outputs from said sources of control signals to said frequency tuning element such that the effects of said control signals upon the frequency of said variable frequency source are additive.

3. In combination, a variable frequency source of signals, a plurality of frequency determining switches the states of which control the frequency of the output from said source, a second source having a frequency of operation that is controllable by application of a control signal to a control element, a gate having input, output, and control terminals and responsive to bias signals applied to said control terminals for controlling transmission from said input to said output, a low-pass filter, the output from said gate, said low-pass filter, and the control element of said second oscillator being connected in tandem in the order recited, means for applying to the input of said gate a signal representative in frequency and phase of the output of said second source, and means responsive to the output of said first source to produce bias signals the magnitude of which is dependent upon the frequency of said first source connected to the input of said gate, said bias means having a plurality of bias determining switches equal in number to the frequency determining switches, the states of said bias determining switches determining the magnitude of said bias signal, each bias determining switch being ganged to a corresponding frequency determining switch to permit simultaneous operation thereof.

4. The combination of claim 3 in which said source of bias signals comprises a first transistor connected in the grounded base configuration, a plurality of resistors equal in number to said bias determining switches each connectable in parallel in the emitter circuit of said first transistor by operation of a different one of said bias switches, a second transistor the base of which is connected to the collector of said first transistor, and a collector circuit for said second transistor coupled to said gate comprising a source of bias potential and a first resistor connected in series to the collector of said second transistor, a second resistor and a diode connected in series, the combination of said second resistor and said diode being connected in parallel with said first resistor, and a third resistor being connected between the junction of said diode and said second resistor and the other terminal of said source of bias potential, said diode being poled such that it is back-biased when said second transistor is cut off and means connecting said source of bias potential between said bias switches and the emitter circuit of said second transistor for applying appropriate biases to said transistors.

References Cited by the Examiner

UNITED STATES PATENTS

| | | | |
|---|---|---|---|
| 2,868,981 | 1/59 | Costas | 331—47 X |
| 3,050,693 | 8/62 | Sinniger | 331—36 X |

ROY LAKE, *Primary Examiner.*

JOHN KOMINSKI, *Examiner.*